United States Patent [19]
Kuth et al.

[11] Patent Number: 5,436,563
[45] Date of Patent: Jul. 25, 1995

[54] MAGNETIC RESONANCE IMAGING APPARATUS

[75] Inventors: Rainer Kuth, Herzogenaurach; Volker Froede, Hemhofen, both of Germany

[73] Assignee: Siemens Aktiengesellschaft, Munich, Germany

[21] Appl. No.: 284,993

[22] Filed: Aug. 4, 1994

[30] Foreign Application Priority Data

Sep. 30, 1993 [DE] Germany .......... 43 33 222.6

[51] Int. Cl.$^6$ .......... G01V 3/00
[52] U.S. Cl. .......... 324/312; 324/307
[58] Field of Search .......... 324/312, 307, 309, 314, 324/317, 318, 322, 306; 128/653.2, 653.5; 364/413.13, 413.14; 382/41, 54

[56] References Cited

U.S. PATENT DOCUMENTS

| | | | |
|---|---|---|---|
| 4,591,789 | 5/1986 | Glover et al. | 324/307 |
| 4,733,188 | 3/1988 | Sekihara et al. | 324/312 |
| 4,740,748 | 4/1988 | Rzedzian | 324/309 |
| 4,789,993 | 12/1988 | Chen et al. | 324/312 |
| 4,841,247 | 6/1989 | Itagaki | 324/309 |
| 5,084,675 | 1/1992 | Reinfelder et al. | 324/309 |
| 5,303,706 | 4/1994 | Moshfeghi | 324/306 |

FOREIGN PATENT DOCUMENTS 0076054 4/1983 European Pat. Off. .

OTHER PUBLICATIONS

"Corrections for Nonuniform Sampling Distortions in Magnetic Resonance Imagery," Trussell et al., IEEE Trans. on Med. Imag., vol. 7, No. 1, Mar. 1988, pp. 32–44.

"A Homogeneity Correction Method for Magnetic Resonance Imaging with Time–Varying Gradients," Noll et al., IEEE Trans. on Med. Imag., vol. 10, No. 4, Dec. 1991, pp. 629–637.

*Primary Examiner*—Louis Arana
*Attorney, Agent, or Firm*—Hill, Steadman & Simpson

[57] ABSTRACT

A magnetic resonance imaging apparatus includes a reception antenna which picks high-frequency magnetic resonance signals, a high-frequency receiver connected to the reception antenna which demodulates the high-frequency magnetic resonance signals and supplies samples of the demodulated magnetic resonance signals, to a signal processing unit which allocates the samples to a spatial frequency space. For avoiding certain types of image artifacts, the signal processing unit includes an interpolation unit which replaces a sample in the spatial frequency space with an interpolated value if the sample deviates from at least one neighboring sample in the spatial frequency space by an amount which upwardly exceeds a limit value.

6 Claims, 1 Drawing Sheet

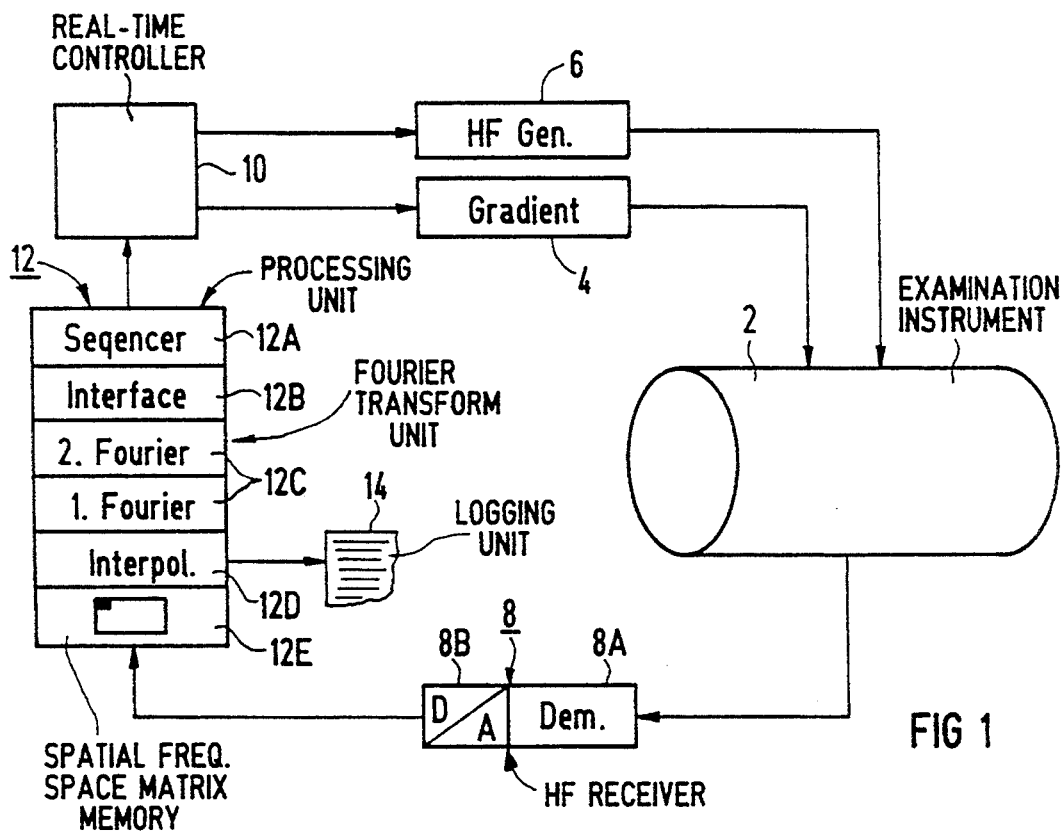
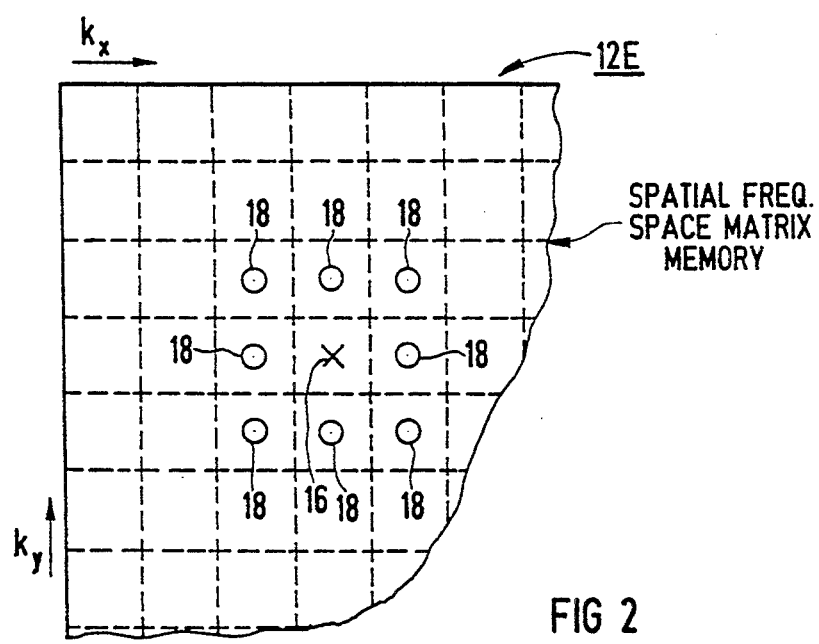

MAGNETIC RESONANCE IMAGING APPARATUS

BACKGROUND OF THE INVENTION

1. Field of the Invention

The invention is directed to a magnetic resonance imaging apparatus of the type having a reception antenna which receives high-frequency magnetic resonance signals from an examination subject, a high-frequency receiver connected to the reception antenna which demodulates the high-frequency magnetic resonance signals and which supplies samples of the demodulated magnetic resonance signals, to a signal processing unit, the signal processing unit allocating the samples to a spatial frequency space.

2. Description of the Prior Art

A magnetic resonance imaging apparatus of the type generally described above is disclosed in European Application 0 076 054. For generating an anatomical image from signals obtained from an examination region of the subject, the echo signals received after an excitation of the nuclear spins in the subject are allocated to a spatial frequency space dependent on various magnetic field gradients which are superimposed on a basic magnetic field, in which the subject is disposed. The spatial frequency space is also known as k-space. If only a single-slice tomogram is to be reconstructed, it is sufficient to occupy a single plane in the spatial frequency space, in which case the spatial frequency space becomes a signal k-plane.

Under unfavorable circumstances, stripe-like artifacts can appear in the reconstructed tomograms. It has now been found that such artifacts are caused by disturbances which are picked up via the reception channel, including the reception antenna, even though the entire examination apparatus including the reception antenna is surrounded by a high-frequency shielded chamber. One cause of this disturbance is believed to be partial discharges at the gradient coils, which occur particularly when the coils are charged with signals (pulses) having steep edges in the chronological curve which defines the gradient fields. Partial discharges can particularly occur given low atmospheric humidity in the examination space. Heretofore, if a tomographic image was obtained in which such artifacts were present, the only recourse was to repeat the measurement sequence so as to obtain a new tomogram.

SUMMARY OF THE INVENTION

It is an object of the present invention to provide a magnetic resonance imaging apparatus of the type generally described above, wherein artifacts in the tomographic image are substantially eliminated, or are at least attenuated, despite the presence of disturbances picked up in the reception channel, so that a repetition of the measurement sequence is not necessary.

The object is achieved in a magnetic resonance imaging apparatus of the type generally described above, wherein the signal processing unit includes an interpolation unit which replaces a sample in the spatial frequency space with an interpolated value when the sample deviates from at least one neighboring sample in the spatial frequency space by an amount which upwardly exceeds a limit value. It is assumed that the neighboring samples in the spatial frequency space will change only slightly given standard sampling rates. Larger deviations of neighboring samples from one another are an indication that disturbances are being superimposed on the samples. Without significant degradation of the image quality, the deviant sample can be replaced with an interpolated value, particularly when only a single sample substantially differs from the values of its neighboring samples.

In an advantageous embodiment, the interpolated value is formed from neighboring samples by means of a linear interpolation of the values of the neighboring samples. This simple interpolation has proven sufficient in practice.

Dependent on the required image quality, the permissible deviation may be in a range from 0.5%–20% of a maximum possible amplitude value of the signals.

Given standard sampling rates, the limit value is in the range between 1% and 5% of the maximum possible amplitude value.

In a further development, the interpolation unit is connected to a logging unit, which logs each time the limit value is exceeded. This provides the user with an indication that the received echoed signals and measured data were modified because disturbances were contained therein. The indication in the log may also be a reason to check the system.

DESCRIPTION OF THE DRAWINGS

FIG. 1 is a schematic block diagram a magnetic resonance imaging system having an interpolation unit and a logging unit, constructed in accordance with the principles of the present invention.

FIG. 2 schematically illustrates an arrangement of the samples in a spatial frequency plane (k-plane) for explaining the operation of the system of FIG. 1.

DESCRIPTION OF THE PREFERRED EMBODIMENTS

The structure and functioning of a medical magnetic resonance imaging apparatus are set forth in detail in the literature, for example in Krestel, "Bildegbende Systeme Fuer Die Medizinische Diagnostik", 2nd ed., 1988, Siemens AG, so that the overview shown in FIG. 1 is limited only to the basic units necessary to explain the invention. The actual examination instrument of the diagnostic magnetic resonance apparatus, in which the various coils are disposed, and in which the patient will be disposed, is generally referenced 2. A primary magnet (not shown) for generating a uniform basic magnetic field, as well as gradient coils (not shown) which superimpose respective magnetic field gradients on the basic magnetic field, are a part of the examination instrument 2. One or more high-frequency antennas, which are also a part of the examination instrument 2, are provided for exciting nuclear spins in the patient and for receiving the resulting magnetic resonance signals emitted by the excited nuclei.

The gradient coils in the examination instrument 2 are connected to gradient power supplies 4, which supply the respective currents required for generating the gradient fields. A high-frequency generator (transmitter) 6 is connected to the transmission antenna. The transmission antenna may also serve as the reception antenna. A high-frequency receiver 8, which includes a low-noise pre-amplifier, is connectable either to the afore-mentioned transmission antenna (serving as a reception antenna) via a transmission/reception diplexor, or to a separate reception antenna (local antenna). The signal shape of the high-frequency pulse which is used to excite the nuclear spins, as well as the triggering thereof, plus the chronological curves of the gradient fields, are prescribed by a real-time controller 10 on the basis of measuring parameters.

The overall system control, as well as evaluation of the reception signals, ensues in a signaling processing unit 12 belonging to a central controller, the signal processing unit 12 serving as a host computer. The signal processing unit 12 includes a sequencer 12A which prescribes the corresponding measuring parameters for the real-time controller 10. The user controls the magnetic resonance apparatus through an interface 12B. The output signals representing the tomographic image are also supplied from the interface 12B to a display monitor (not shown) having a picture screen on which the reconstructed tomogram is shown.

The high-frequency magnetic resonance signals picked up by the reception antenna are demodulated in a phase-dependent demodulator 8A in the high-frequency receiver 8, and are subsequently sampled and digitized in an analog-to-digital converter 8B, also in the high-frequency receiver 8. Corresponding to the gradients and the high-frequency pulses prescribed by the sequencer 12A, the samples are allocated to a spatial frequency space or to a plane in the spatial frequency space if a single-slice tomogram is to be produced. This allocation is accomplished by storing the respective samples at corresponding memory locations in a spatial frequency space matrix memory 12E.

The image reconstruction ensues by means of a two-dimensional Fourier transformation of the data contained in the spatial frequency space matrix memory 12E in two stages of a Fourier transform unit 12C. An interpolation unit 12D is connected between the matrix memory 12E and the Fourier transform unit 12C. The interpolation unit 12D examines each sample with respect to one or more of its neighboring samples in the memory locations of the matrix memory 12E, and compares the respective differences value of a given sample and its neighbors to a predetermined limit value. If the interpolation unit 12D determines that a sample in the spatial frequency space deviates from at least one neighboring sample by upwardly exceeding the limit value, the interpolation unit 12D causes that sample to be replaced with an interpolated value. The permissible deviation, i.e. the limit value, can be prescribed through the user interface 12B. During normal operation, the limit value lies between 1% and 5%, typically at 2% of a maximum possible amplitude of the samples. The maximum range of adjustment of the limit value, however, can be varied between 0.5% and 20%.

A logging unit 14 is connected to the interpolation unit 12D. The logging unit 14 registers each time the limit value is exceeded and identifies the date and time of day thereof. The contents of the logging unit 14 can be called via the user interface 12B and reviewed.

FIG. 2 shows a portion of the k-space, in the form of data stored in a portion of the spatial frequency space matrix memory 12E. The rows of the matrix contain values $k_x$ and the columns contain the values $k_y$.

The interpolator 12D includes a comparator which compares the neighboring samples in the spatial frequency plane (k-plane) for deviations greater than, for example, 2% In FIG. 2, a cross 16 identifies a sample which has been determined to deviate by more than 2% from its neighboring values, which are identified by circles 18. The sample 16 is replaced by the interpolation unit 12D with an interpolated value which is formed from a linear interpolation of the respective values of neighboring samples 18. Either an interpolation using row values, i.e., using the neighboring $k_x$ values, or an interpolation of column values, i.e. using the neighboring $k_y$ values, can be implemented. (In the case of a true k-space, neighboring values in a third dimension will also be present, providing a third alternative for the interpolation.) It is also possible to form an interpolated value from all of the neighboring samples 18. Due to the interpolation in the spatial frequency space, or in the spatial frequency plane, the tomogram calculated therefrom by means of the Fourier transformations may possibly lose a certain of resolution. Stripe-like artifacts due to super-elevated samples 16 (spikes), however, do not occur in the tomograph.

Although modifications and changes may be suggested by those skilled in the art, it is the intention of the inventors to embody within the patent warranted hereon all changes and modifications as reasonably and properly come within the scope of their contribution to the art.

I claim as my invention:

1. In a magnetic resonance apparatus having a reception antenna which picks up high-frequency magnetic resonance signals from a subject, a high-frequency receiver connected to the reception antenna which demodulates the high-frequency magnetic resonance signals and supplies digitized samples of the demodulated magnetic resonance signals to a signal processing unit which allocates the samples to a spatial frequency space in a matrix memory, the improvement comprising:

interpolation means in said signal processing unit for identifying if a sample in said spatial frequency space deviates from at least one neighboring sample in said spatial frequency space by exceeding a predetermined limit value, and for replacing any sample exhibiting a deviation exceeding said limit value with an interpolated value.

2. A magnetic resonance imaging apparatus as claimed in claim 1, wherein said interpolation means comprises means for forming said interpolated value from samples in said spatial frequency space neighboring the sample exhibiting the deviation, by a linear interpolation of the neighboring samples.

3. A magnetic resonance imaging apparatus as claimed in claim 1, wherein said samples in said spatial frequency space have a maximum possible amplitude value, and wherein said interpolation means comprises means for selecting said limit value in a range between 0.5% and 20% of said maximum possible amplitude value.

4. A magnetic resonance imaging apparatus as claimed in claim 3, wherein said interpolation means comprises means for selecting said limit value in a range between 1% and 5% of said maximum possible amplitude value.

5. A magnetic resonance imaging apparatus as claimed in claim 1, wherein the improvement further comprises logging means, connected to said interpolation means, for logging each time a sample deviates from said at least one neighboring sample by upwardly exceeding limit value.

6. A magnetic resonance imaging apparatus as claimed in claim 5, wherein said logging means comprises means for registering a date and time of day for each time a sample deviates from said at least one neighboring sample by upwardly exceeding said limit value.

* * * * *